United States Patent
Carey et al.

(10) Patent No.: US 8,015,694 B2
(45) Date of Patent: Sep. 13, 2011

(54) METHOD FOR MAKING A SCISSORING-TYPE CURRENT-PERPENDICULAR-TO-THE-PLANE (CPP) MAGNETORESISTIVE SENSOR

(75) Inventors: Matthew J. Carey, San Jose, CA (US); Jeffrey R. Childress, San Jose, CA (US); Stefan Maat, San Jose, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 937 days.

(21) Appl. No.: 11/959,102

(22) Filed: Dec. 18, 2007

(65) Prior Publication Data
US 2009/0154025 A1 Jun. 18, 2009

(51) Int. Cl.
*G11B 5/127* (2006.01)
*H04R 31/00* (2006.01)

(52) U.S. Cl. ............... 29/603.16; 29/603.13; 29/603.14; 29/603.15; 29/603.18; 216/62; 216/65; 216/66; 360/324.1; 360/324.11; 360/324.12; 360/324.2; 451/5; 451/41

(58) Field of Classification Search ............... 29/603.07, 29/603.13–603.16, 603.18; 216/62, 65, 66; 360/324.1, 324.11, 324.12, 324.2; 427/127–131
See application file for complete search history.

(56) References Cited

U.S. PATENT DOCUMENTS

| | | | |
|---|---|---|---|
| 5,576,914 A | 11/1996 | Rottmayer et al. | |
| 5,905,611 A | 5/1999 | Yoda et al. | |
| 6,937,447 B2 * | 8/2005 | Okuno et al. | 360/324.1 |
| 7,035,062 B1 | 4/2006 | Mao et al. | |
| 7,360,300 B2 * | 4/2008 | Carey et al. | 29/603.16 |
| 7,382,586 B2 * | 6/2008 | Carey et al. | 360/324.1 |
| 7,672,090 B2 * | 3/2010 | Carey et al. | 360/324.12 |
| 2006/0218775 A1 | 10/2006 | Carey et al. | |
| 2006/0221515 A1 | 10/2006 | Carey et al. | |
| 2007/0035894 A1 | 2/2007 | Freitag et al. | |

OTHER PUBLICATIONS

Seigler, et al., "Current-perpendicular-to-plane multilayer sensors for magnetic recording", IEEE Transactions on Magnetics, vol. 39(3), May 2003, pp. 1855-1858.

* cited by examiner

*Primary Examiner* — Paul D Kim
(74) *Attorney, Agent, or Firm* — Thomas R. Berthold

(57) ABSTRACT

A "scissoring-type" current-perpendicular-to-the-plane (CPP) magnetoresistive sensor with dual ferromagnetic sensing or free layers separated by a nonmagnetic spacer layer has improved stability as a result of etch-induced uniaxial magnetic anisotropy in each of the free layers. Each of the two ferromagnetic free layers has an etch-induced uniaxial magnetic anisotropy and an in-plane magnetic moment substantially parallel to its uniaxial anisotropy in the quiescent state, i.e., the absence of an applied magnetic field. The etch-induced uniaxial anisotropy of each of the free layers is achieved either by direct ion etching of each of the free layers, and/or by ion etching of the layer on which each of the free layers is deposited. A strong magnetic anisotropy is induced in the free layers by the etching, which favors generally orthogonal orientation of the two free layers in the quiescent state.

4 Claims, 4 Drawing Sheets

METHOD FOR MAKING A SCISSORING-TYPE CURRENT-PERPENDICULAR-TO-THE-PLANE (CPP) MAGNETORESISTIVE SENSOR

BACKGROUND OF THE INVENTION

1. Field of the Invention

The invention relates generally to a current-perpendicular-to-the-plane (CPP) magnetoresistive (MR) sensor that operates with the sense current directed perpendicularly to the planes of the layers making up the sensor stack, and more particularly to a scissoring-type CPP sensor with dual sensing or free layers.

2. Background of the Invention

One type of conventional magnetoresistive (MR) sensor used as the read head in magnetic recording disk drives is a sensor based on the giant magnetoresistance (GMR) effect. A GMR sensor has a stack of layers that includes two ferromagnetic layers separated by a nonmagnetic electrically conductive spacer layer, which is typically copper (Cu). In one type of GMR sensor, called a "spin-valve", one of the ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor and in the presence of an applied magnetic field, the rotation of the free-layer magnetization relative to the fixed-layer magnetization is detectable as a change in electrical resistance.

In a magnetic recording disk drive spin-valve read sensor or head, the stack of layers are located in the read "gap" between magnetic shields. The magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the stack is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor.

A CPP-GMR spin-valve type of read head is described by A. Tanaka et al., "Spin-valve heads in the current-perpendicular-to-plane mode for ultrahigh-density recording", IEEE TRANSACTIONS ON MAGNETICS, 38 (1): 84-88 Part 1 January 2002. Another type of CPP sensor is a magnetic tunnel junction sensor, also called a tunneling magnetoresistance or TMR sensor, in which the nonmagnetic spacer layer is a very thin nonmagnetic tunnel barrier layer. In a CPP-TMR sensor the tunneling current flows perpendicularly through the layers depends on the relative orientation of the magnetizations in the two ferromagnetic layers. Like a CPP-GMR spin-valve type of read head, a CPP-TMR read head also has one of the ferromagnetic layers with its magnetization direction fixed or pinned and the other ferromagnetic layer with its magnetization direction free to rotate in the presence of an applied magnetic field from data recorded on the disk. However, in a CPP-GMR read head the spacer layer is formed of an electrically conductive material, such as Cu or other metal or metal alloy, while in a CPP-TMR read head the spacer layer is formed of an electrically insulating material, such as $TiO_2$, $MgO$ or $Al_2O_3$.

A type of CPP sensor has been proposed that does not have a ferromagnetic layer with a fixed or pinned magnetization direction, but instead has dual ferromagnetic sensing or free layers separated by a nonmagnetic spacer layer. In the absence of an applied magnetic field, the magnetization directions or vectors of the two free layers are oriented generally orthogonal to one another with parallel magnetization components in the sensing direction of the magnetic field to be detected and antiparallel components in the orthogonal direction. With a sense current applied perpendicularly to the layers in the sensor stack and in the presence of an applied magnetic field in the sensing direction, the two magnetization vectors rotate in opposite directions, changing their angle relative to one another, which is detectable as a change in electrical resistance. Because of this type of behavior of the magnetization directions of the two free layers, this type of CPP sensor will be referred to herein as a "scissoring-type" of CPP sensor. If a CPP-GMR scissoring-type sensor is desired the nonmagnetic spacer layer is an electrically conducting metal or metal alloy. If a CPP-TMR scissoring-type sensor is desired the spacer layer is an electrically insulating material. In a scissoring-type CPP sensor, a single layer of hard magnetic material at the back of the sensor, opposite the air-bearing surface, is used to bias the magnetization directions so that they are roughly orthogonal to one another in the quiescent state, i.e., in the absence of an applied magnetic field. Without the hard bias layer, the magnetization directions of the two free layers would tend to be oriented antiparallel to one another. This tendency to be oriented antiparallel results from strong magnetostatic interaction between the two free layers once they have been patterned to sensor dimensions, but may also be the result of exchange coupling between the magnetic layers through the spacer. The scissoring-type of CPP sensor is described by Seigler, et al., "Current-perpendicular-to-plane multilayer sensors for magnetic recording", IEEE Transactions on Magnetics, Vol. 39(3), May 2003, pp. 1855-1858, and in U.S. Pat. No. 7,035,062 B2. Unlike in a conventional CPP GMR or TMR sensor, in a scissoring-type CPP sensor there is no need for an antiferromagnetic pinning layer. Accordingly, the read-gap and parasitic series electrical resistances are greatly reduced. This enables an enhanced down-track resolution and a stronger magnetoresistance signal.

In a scissoring-type CPP sensor, the detected signal field is aligned collinearly with the bias field from the hard bias layer above the sensor, rather than orthogonally as in the case of a conventional GMR spin-valve type senor with two hard bias layers on each side. In situations where the signal field is antiparallel to the bias field, the total applied field on the scissoring-type sensor is reduced in magnitude, and it is more susceptible to magnetic instability (particular that originating at track edges) than a spin-valve type sensor where the total applied field on the sensor is never smaller than the hard bias field (which is strongest at the track edges). This generally makes the stabilization of the scissoring-type sensor more difficult compared to a spin-valve sensor.

What is needed is a scissoring-type CPP sensor with improved stability, where the magnetization directions of the two free layers are more easily maintained generally orthogonal to one another in the quiescent state.

SUMMARY OF THE INVENTION

The invention is a scissoring-type CPP sensor with improved stability. Each of the two ferromagnetic free layers has an etch-induced uniaxial magnetic anisotropy and an in-plane magnetic moment substantially parallel to its uniaxial anisotropy in the quiescent state, i.e., the absence of an applied magnetic field. The etch-induced uniaxial anisotropy of each of the free layers is achieved either by direct etching of each of the free layers, and/or by etching of the layer on which each of the free layers is deposited. A strong magnetic anisotropy (with an anisotropy field of about 100 Oe or greater) is induced in the free layers by the etching, which favors generally orthogonal orientation of the two free layers in the quiescent state.

The invention is also a method of making the scissoring-type CPP sensor, which includes directional ion etching of the selected layer or layers to induce the uniaxial anisotropy.

For a fuller understanding of the nature and advantages of the present invention, reference should be made to the following detailed description taken together with the accompanying figures.

DETAILED DESCRIPTION OF THE INVENTION

Figure 1:
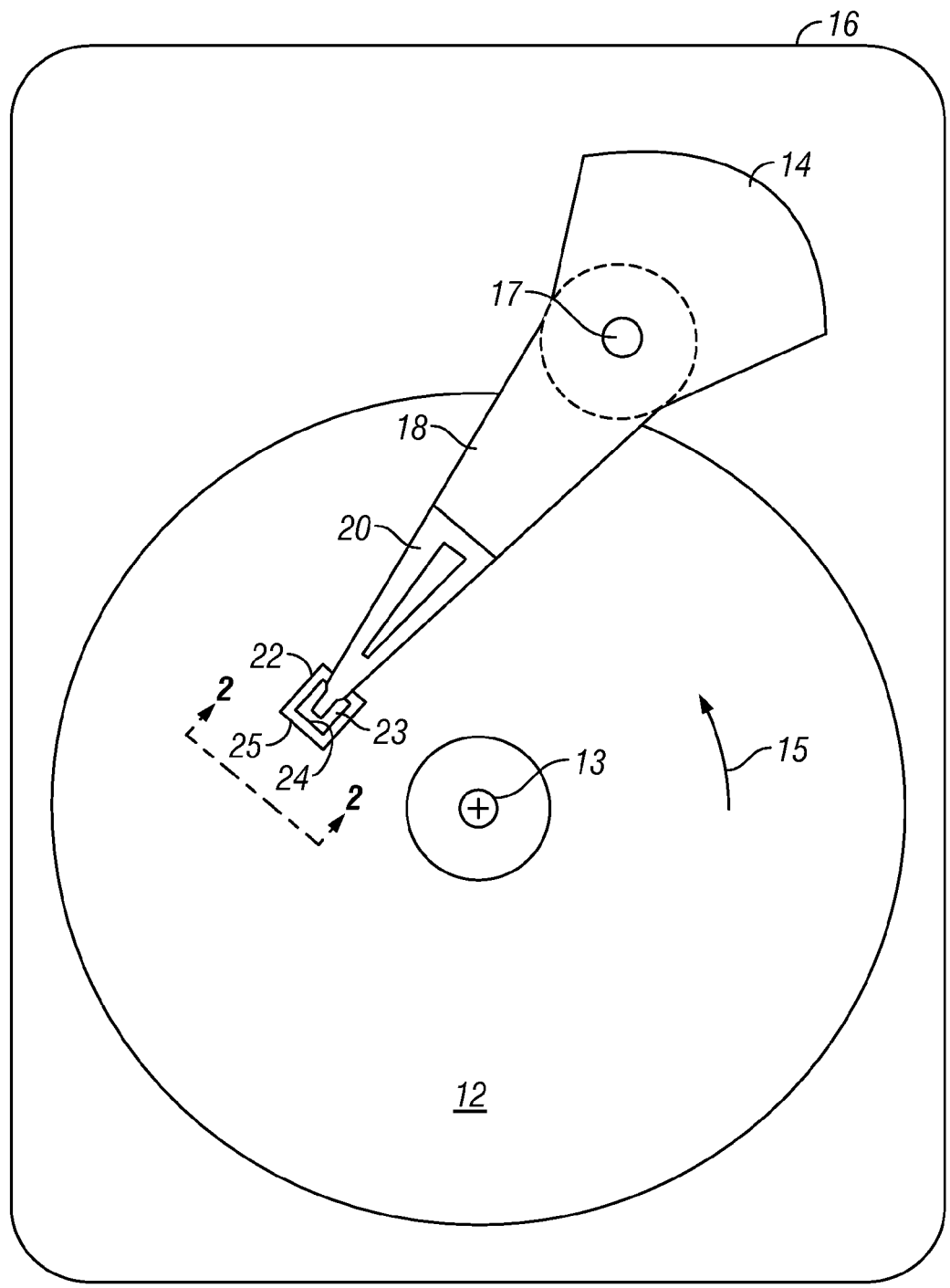
FIG. 1 is a schematic top view of a conventional magnetic recording hard disk drive with the cover removed.

The CPP magnetoresistive (MR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
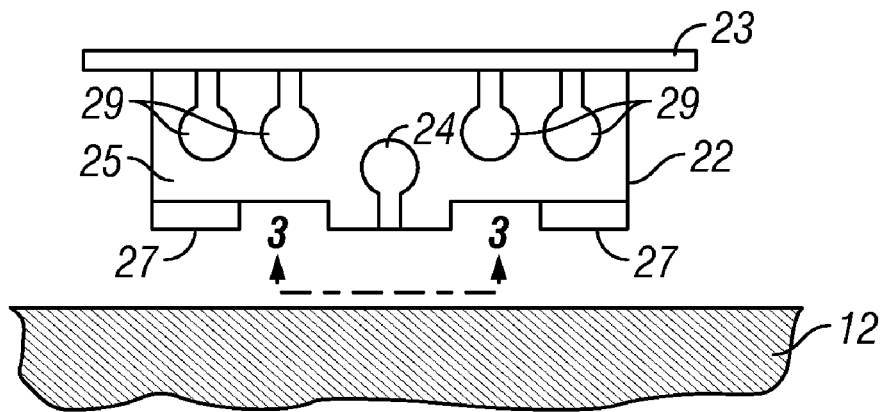
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
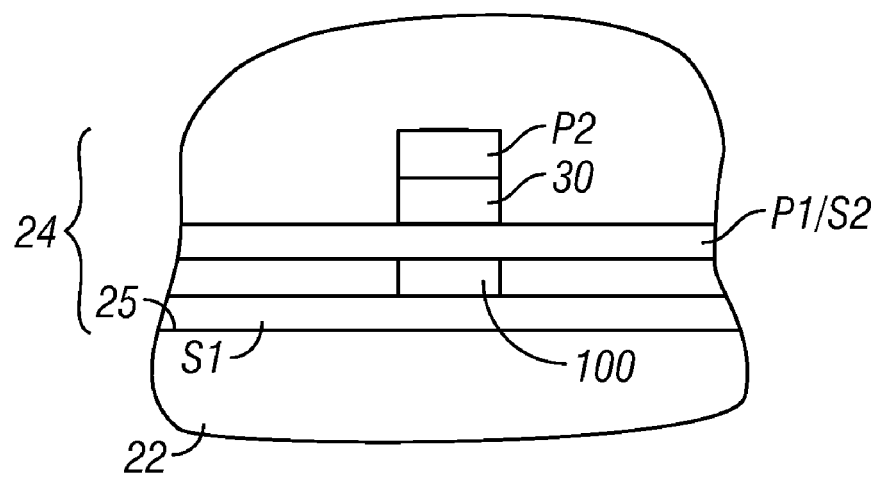
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP MR sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4A:
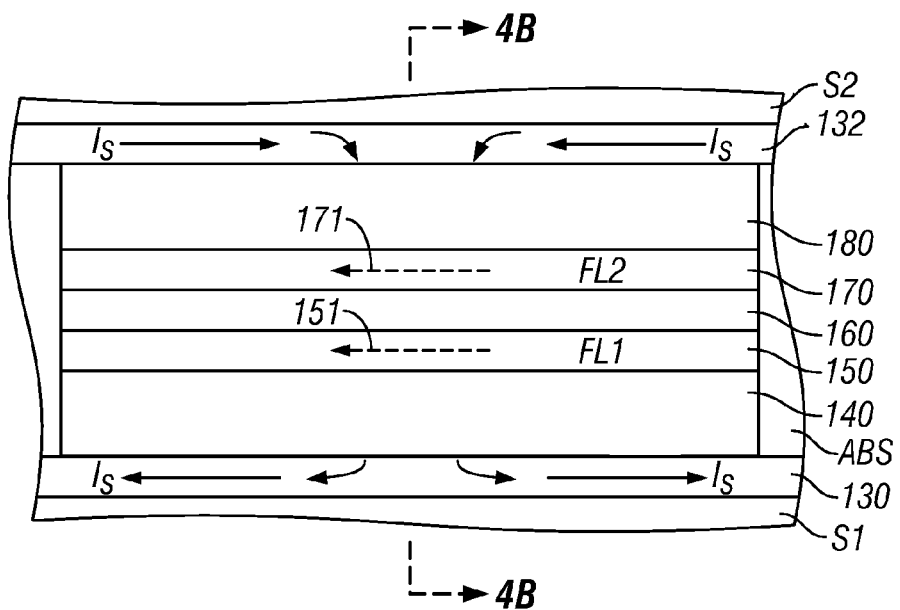
FIG. 4A is a cross-sectional schematic view facing the air-bearing surface (ABS) of the scissoring-mode CPP read head according to this invention and showing the stack of layers located between the magnetic shield layers.

FIG. 4A is an enlarged sectional view of the CPP sensor 100 according to this invention and is a view facing the ABS. Sensor 100 is a scissoring-type CPP GMR or TMR read head comprising a stack of layers, including dual sensing or free layers, formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers are a first ferromagnetic free or sensing layer (FL1) 150 having a magnetic moment or magnetization direction 151 and a second ferromagnetic free or sensing layer (FL2) 170 having a magnetic moment or magnetization direction 171.

FL1 and FL2 are typically formed of conventional ferromagnetic materials like crystalline CoFe or NiFe alloys, or a multilayer of these materials, such as a CoFe/NiFe bilayer. Instead of these conventional ferromagnetic materials, FL1 and FL2 may be formed of or comprise a ferromagnetic Heusler alloy, some of which are known to exhibit high spin-polarization in their bulk form. Full and half Heusler alloys are intermetallics with particular composition and crystal structure. Examples of Heusler alloys include but are not limited to the full Heusler alloys $Co_2MnX$ (where X is one or more of Al, Sb, Si, Sn, Ga, or Ge). Examples also include but are not limited to the half Heusler alloys NiMnSb, PtMnSb, and $Co_2Fe_xCr_{(1-x)}Al$ (where x is between 0 and 1). A perfect Heusler alloy with 100% spin-polarization will result in large magnetoresistance when incorporated into a CPP sensor. However it is possible that in a thin-film form and at finite temperatures, the band structure of the Heusler alloy may deviate from its optimal structure and that the spin polarization will decrease. For example, some alloys may exhibit chemical site disorder and crystallize in the B2 structure instead of the $L2_1$ Heusler structure. Nevertheless, a high magnetoresistance can still be obtained as long as the spin polarization exceeds that of conventional ferromagnetic alloys, or if spin-dependent scattering in the Heusler alloy is high. Thus, as used herein a "Heusler alloy" shall mean an alloy with a composition substantially the same as that of a known Heusler alloy, and which results in high magnetoresistance due to enhanced spin polarization and/or enhanced spin-dependent scattering compared to conventional ferromagnetic materials such as NiFe and CoFe alloys.

FL1 and FL2 comprise self-referenced free layers, and hence no pinned or pinning layers are required, unlike in conventional CPP spin-valve type sensors. FL1 and FL2 have their magnetization directions 151, 171, respectively, oriented in-plane and approximately orthogonal to one another in the absence of an applied magnetic field. While the magnetic moments 151, 171 in the quiescent state (the absence of an applied magnetic field) are oriented approximately orthogonal, i.e., 90 degrees to each other, they may be oriented by less or more than 90 degrees, depending on the bias point at which the sensor 100 is operated. FL1 and FL2 are separated by a nonmagnetic spacer layer 160. Spacer layer 160 is a nonmagnetic electrically conductive metal or metal alloy, like Cu, Au, Ag, Ru, Rh, Cr and their alloys, if the sensor 100 is a CPP GMR sensor, and a nonmagnetic insulating material, like $TiO_2$, MgO or $Al_2O_3$, if the sensor 100 is a CPP TMR sensor.

Located between the lower shield layer S1 and the FL1 are the bottom electrical lead 130 and an underlayer or seed layer 140. The seed layer 140 may be a single layer or multiple layers of different materials. Located between FL2 and the upper shield layer S2 are a capping layer 180 and the top electrical lead 132. The leads 130, 132 are typically Ta or Rh, with lead 130 serving as the substrate for the sensor stack. However, a lower resistance material may also be used. They are optional and used to adjust the shield-to-shield spacing. If the leads 130 and 132 are not present, the bottom and top shields S1 and S2 are used as leads, with S1 then serving as the substrate for the deposition of the sensor stack. The underlayer or seed layer 140 is typically one or more layers of NiFeCr, NiFe, Ta, Cu or Ru. The capping layer 180 provides corrosion protection and is typically formed of single layers, like Ru or Ta, or multiple layers of different materials, such as a Cu/Ru/Ta trilayer.

In the presence of an external magnetic field in the range of interest, i.e., magnetic fields from recorded data on the disk 12, the magnetization directions 151 and 171 of FL1 and FL2, respectively, will rotate in opposite directions. Thus when a sense current $I_s$ is applied from top lead 132 perpendicularly through the stack to bottom lead 130, the magnetic fields from the recorded data on the disk will cause rotation of the magnetizations 151, 171 in opposite directions relative to one another, which is detectable as a change in electrical resistance.

In this invention, FL1 and FL2 have etch-induced uniaxial magnetic anisotropy. Uniaxial magnetic anisotropy of a ferromagnetic layer imparts an energetic preference for the magnetization to align collinear to the anisotropy axis, referred to as the easy axis, which (at the bulk film level) is the lowest energy state. The etch-induced uniaxial anisotropy of FL1 and FL2 enables the relative orientation of the easy axes of this source of anisotropy to be chosen and maintained irrespective of the actual geometry of the sensor. The etch-induced uniaxial anisotropy of each of FL1 and FL2 is achieved either by direct etching of FL1 and FL2, and/or by etching of the layer on which FL1 and FL2 are deposited, i.e., seed layer 240 in the case of FL1 and spacer layer 160 in the case of FL2.

Figure 4B:
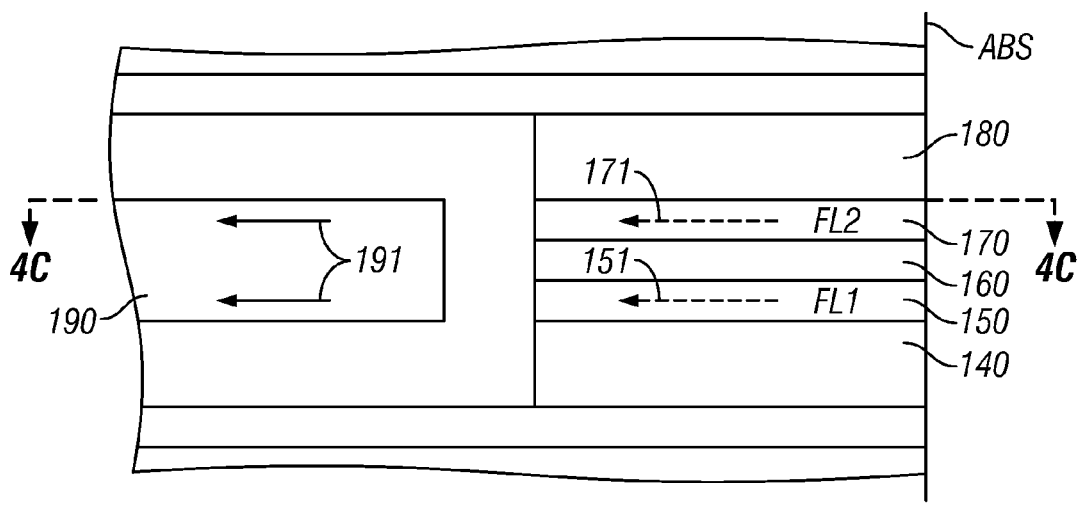
FIG. 4B is a view of section 4B-4B of FIG. 4A and shows the ABS in edge view.
Figure 4C:
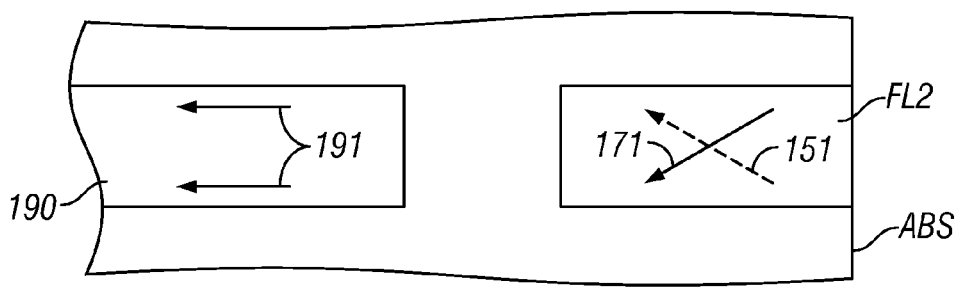
FIG. 4C is a view of section 4C-4C of FIG. 4B and shows the ABS in edge view.

FIG. 4B is a sectional view along the plane 4B-4B in FIG. 4A and shows the ABS as a plane normal to the paper. FIG. 4C is a view along the plane 4C-4C in FIG. 4B and also shows the ABS as a plane normal to the paper. FIG. 4C shows the in-plane generally orthogonal relative orientation of magnetization directions 151, 171, with magnetization direction 151 being depicted as a dashed arrow because it is the magnetization direction of underlying FL1 which is not visible in FIG. 4C. As can be seen from FIG. 4C, in the absence of an applied magnetic field, the magnetization directions or vectors 151, 171 have parallel components in the sensing direction of the magnetic field to be detected (perpendicular to the ABS) and antiparallel components in the orthogonal direction (parallel to the ABS). FIGS. 4B and 4C show a hard bias layer 190 recessed from the ABS, which may be used in this invention together with the etch-induced uniaxial anisotropic FL1 and FL2. The hard bias layer 190, which is described in the prior art scissoring-mode CPP sensor, is a hard magnet magnetized in-plane in the direction 191. Hard bias layer 190 stabilizes or biases the FL1, FL2 magnetization directions 151, 171 in their generally orthogonal relative orientation by rotating them away from what would otherwise be an antiparallel orientation. Hard bias layer 190 may be formed of a CoPt or CoPt Cr alloy or other relatively high coercivity ferromagnetic material. Referring to FIG. 4C, in the scissoring-type CPP sensor, the detected signal field is generally perpendicular to the ABS and is aligned generally collinearly with the bias field 191 from the hard bias layer 190. In situations where the signal field is antiparallel to the bias field 191, the total applied field on the sensor (FL1 and FL2) is reduced in magnitude, and thus the sensor can be susceptible to magnetic instability (particular that originating at track edges). In the present invention this can be alleviated to a significant degree by a strong etch-induced magnetic anisotropy in FL1 and FL2 (with an anisotropy field of about 100 Oe or greater) that favors generally orthogonal orientation of FL1 and FL2.

Figure 5A:
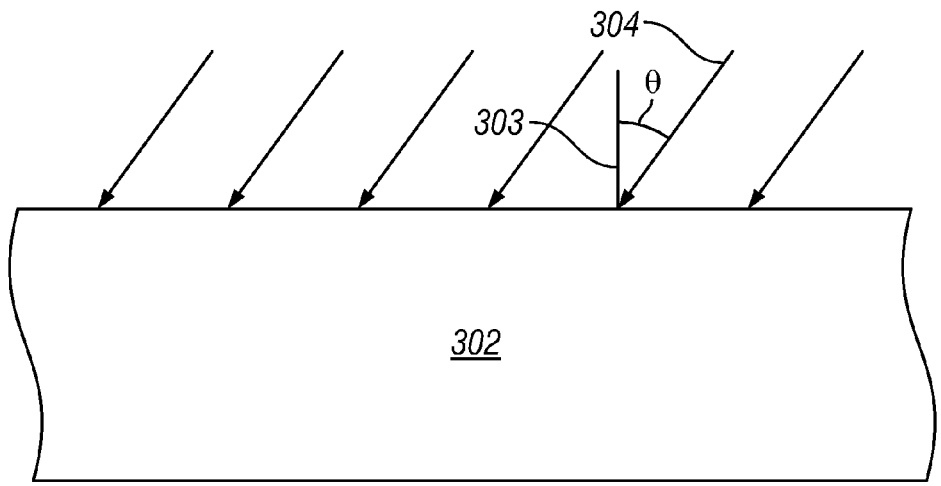
FIGS. 5A-5C illustrate the method of this invention for directional ion etching of the selected layer or layers to induce uniaxial anisotropy in the free ferromagnetic layers of the sensor.
Figure 5B:
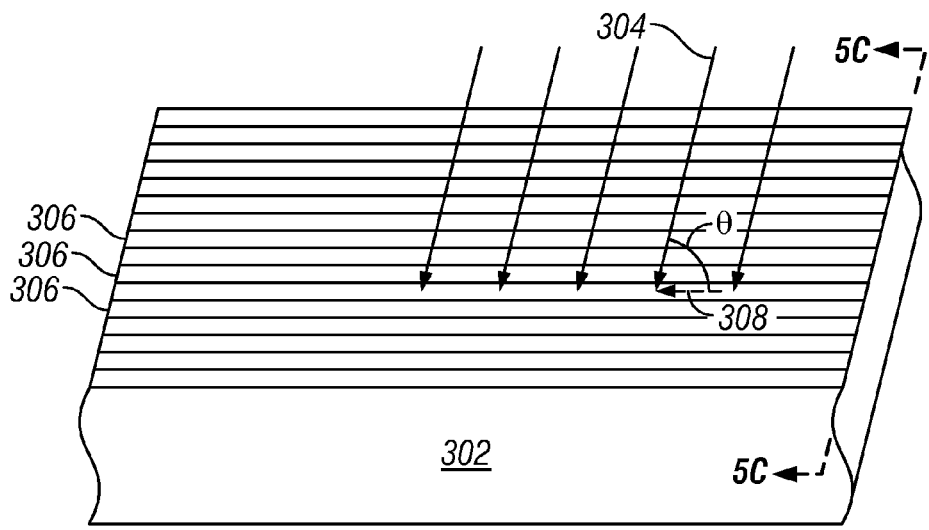
Figure 5C:
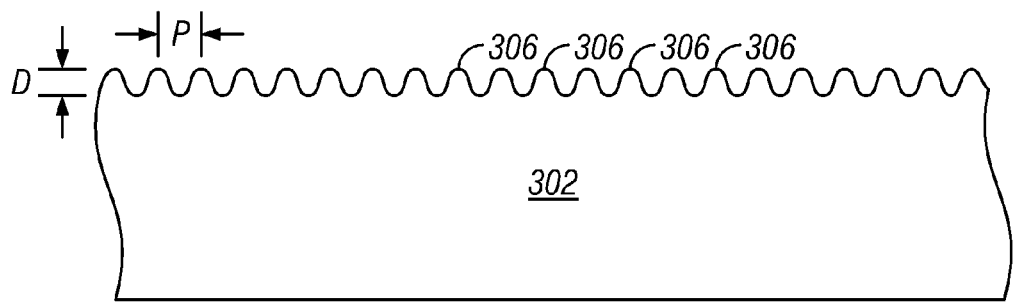

FIGS. 5A-5C illustrate the method of directional ion etching of the selected layer or layers to induce uniaxial anisotropy. The layer to be etched is designated as layer 302. In one embodiment, layer 302 would be first FL1 150 and then FL2 170, each of which would typically be a 75-100 Å CoFe layer. First an ion beam etch 304 is performed with the ion beam directed at an oblique angle θ with respect to a normal 303 to the surface of the layer 302. The angled ion etch induces roughness in the form of oriented facets, grooves or ripples 306 (FIG. 3B) that can run in a direction substantially parallel or perpendicular to the in-plane projection 308 of the ion beam onto the surface of the layer 302. As shown in FIG. 5C, the typical average pitch P of the ripples 306 is between about 1 to 50 nm and their depth D is between about 0.1 to 5 nm. FL1 150 will then have an induced uniaxial magnetic anisotropy that is either parallel to or orthogonal to the direction of the in-plane projection 308 of the ion beam onto the surface of the layer 302. The determination of which of these two directions results from the ion etching is made experimentally and depends primarily on the composition of the material being etched. Next, the spacer layer 160 is deposited onto the etched surface of FL1 150, and FL2 170 is deposited on the spacer layer 160. The sensor is then rotated (e.g., by 90 degrees) about an axis 303 normal to the surface of the layers. FL2 170 is then etched by the ion beam in the same manner. The result is the two free layers FL1 and FL2 will have independently oriented induced uniaxial magnetic anisotropy axes that help to stabilize the approximately orthogonal relative orientation of their respective magnetization directions 151, 171, as depicted in FIG. 4C.

The angled ion etch 304 is preferably performed at an angle θ of between about 20 and 80 degrees and is more preferably performed at an angle of between about 35 and 65 degrees with respect to the normal 303 to the surface of the layer 302 being etched. The voltage, current, and angle conditions depend on the type and characteristics of the ion source and the material being etched. The ions are preferably Ar ions, but Xe, or Kr or other noble gas ions are also expected to provide acceptable etching. It has been determined experimentally that the optimum etching occurs near the threshold of ion beam energy where material first begins to be etched away. In the case of a 100 Å CoFe layer, a relatively low energy (100 eV) ion beam is applied at θ=45 degrees to etch the CoFe to a final thickness of about 50 Å.

Instead of or in addition to etching FL1 and FL2, the seed layer 140 and spacer layer 160, each of which is the respective underlayer for FL1 and FL2, may be etched in the same manner. If the underlayers are etched, then in one example layer 302 in FIGS. 5A-5C would be a 100 Å seed layer 140 which is etched to a final thickness of about 50 Å. The etching is done with the appropriate substrate orientation relative to the ion beam to create the desired magnetization direction 151 for the subsequently deposited FL1 150. A 50 Å CoFe FL1 150 is then deposited onto the etched Ta underlayer 140. FL1 150 will generally replicate the directionally etched surface topography of underlayer 140, resulting in etch-induced uniaxial magnetic anisotropy of FL1. Next, assuming the sensor being fabricated is a CPP GMR sensor, a 75 to 100 Å Cu spacer layer 160 is deposited. The substrate is then rotated (e.g., by 90 degrees) about an axis 303 normal to the surface of the layers. The Cu spacer layer is then ion etched to a final thickness of about 30 to 50 Å. A 50 Å CoFe layer is then deposited onto the etched Cu spacer layer 160 to form FL2 170. FL2 170 will generally replicate the directionally etched surface topography of the Cu spacer layer 160, resulting in etch-induced uniaxial magnetic anisotropy of FL2.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a scissoring-type current-perpendicular-to-the-plane (CPP) magnetoresistive sensor comprising:
    providing a substrate;
    depositing an underlayer on the substrate;
    depositing a first ferromagnetic free layer on the underlayer;
    depositing a nonmagnetic spacer layer on the first ferromagnetic layer;
    depositing a second ferromagnetic free layer on the spacer layer;
    after depositing at least one layer selected from a first group consisting of said underlayer and said first free layer, directing an ion beam to said at least one layer from said first group at an oblique angle relative to a normal to the surface of said at least one layer from said first group to directionally etch the surface of said at least one layer from said first group;
    after etching the surface of said at least one layer from said first group, rotating the substrate relative to the ion beam about a normal to the surface of the substrate; and
    after depositing at least one layer selected from a second group consisting of said spacer layer and said second free layer, directing an ion beam to said at least one layer from said second group at an oblique angle relative to a normal to the surface of said at least layer from said second group to directionally etch the surface of said at least one layer from said second group.

2. The method of claim 1 wherein directing an ion beam to said at least one layer from said first group at an oblique angle comprises directing at an angle between about 20 and 80 degrees, and directing an ion beam to said at least one layer from said second group at an oblique angle comprises directing at an angle between about 20 and 80 degrees.

3. The method of claim 1 wherein depositing the spacer layer comprises depositing a layer of electrically conducting metal or metal alloy.

4. The method of claim 1 wherein depositing the spacer layer comprises depositing a layer of electrically insulating material.

* * * * *